United States Patent
Biber et al.

(10) Patent No.: US 10,330,756 B2
(45) Date of Patent: Jun. 25, 2019

(54) METHOD AND APPARATUS FOR EDDY CURRENT FIELD COMPENSATION IN MAGNETIC RESONANCE TOMOGRAPHY

(71) Applicant: Siemens Healthcare GmbH, Erlangen (DE)

(72) Inventors: Stephan Biber, Erlangen (DE); Matthias Gebhardt, Erlangen (DE); Andreas Krug, Fuerth (DE)

(73) Assignee: Siemens Healthcare GmbH, Erlangen (DE)

(*) Notice: Subject to any disclaimer, the term of this patent is extended or adjusted under 35 U.S.C. 154(b) by 129 days.

(21) Appl. No.: 15/367,597

(22) Filed: Dec. 2, 2016

(65) Prior Publication Data
US 2017/0160357 A1    Jun. 8, 2017

(30) Foreign Application Priority Data

Dec. 2, 2015 (DE) .................. 10 2015 224 043

(51) Int. Cl.
| | | |
|---|---|---|
| G01R 33/385 | (2006.01) | |
| G01R 33/389 | (2006.01) | |
| G01R 19/00 | (2006.01) | |
| G01R 33/38 | (2006.01) | |
| G01R 33/3815 | (2006.01) | |

(52) U.S. Cl.
CPC ....... G01R 33/389 (2013.01); G01R 19/0092 (2013.01); G01R 33/3804 (2013.01); G01R 33/385 (2013.01); G01R 33/3815 (2013.01)

(58) Field of Classification Search
CPC .............. G01R 33/389; G01R 33/3804; G01R 33/3815; G01R 33/385; G01R 19/0092
USPC ................................................... 324/300–322
See application file for complete search history.

(56) References Cited

U.S. PATENT DOCUMENTS

| | | | | |
|---|---|---|---|---|
| 5,551,243 A  * | 9/1996 | Palkovich | ............. | F25D 19/006 |
| | | | | 505/892 |
| 7,002,343 B2 * | 2/2006 | Weissenberger | ... | G01R 33/3875 |
| | | | | 324/309 |
| 7,535,225 B2 * | 5/2009 | Dietz | ................. | G01R 33/3815 |
| | | | | 324/307 |
| 9,013,185 B2 * | 4/2015 | Brown | ................. | G01R 33/422 |
| | | | | 324/309 |
| 9,091,743 B2 * | 7/2015 | Biber | ................... | G01R 33/421 |
| 9,229,078 B2 * | 1/2016 | Dietz | ................. | G01R 33/3854 |
| 9,513,351 B2 * | 12/2016 | Biber | ................. | G01R 33/3642 |
| 2003/0023157 A1 * | 1/2003 | Gebhardt | ............... | A61B 5/055 |
| | | | | 600/410 |

(Continued)

OTHER PUBLICATIONS

Reese et al., Reduction of Eddy-Current-Induced Distortion in Diffusion MRI Using a Twice-Refocused Spin Echo. Magnetic Resonance in Medicine 49: pp. 177-182 (Copyright 2003 Wiley-Liss, Inc.).*

*Primary Examiner* — Patrick Assouad
*Assistant Examiner* — Sean Curtis
(74) *Attorney, Agent, or Firm* — Schiff Hardin LLP

(57) ABSTRACT

In a method and an apparatus for magnetic resonance tomography, an eddy current field is compensated by taking into account its progression over time and its dependence on a sensed value, by having a sensor determine the sensed value and, on the basis of the sensed value, a current strength for a conductor in order to generate an opposing field to reduce the eddy current field is determined, and supplied to the conductor.

7 Claims, 2 Drawing Sheets

(56) References Cited

U.S. PATENT DOCUMENTS

| | | | |
|---|---|---|---|
| 2009/0209842 A1* | 8/2009 | Koevoets | G01R 33/3854 600/410 |
| 2011/0224479 A1* | 9/2011 | Yager | A61N 1/406 600/10 |
| 2011/0288411 A1* | 11/2011 | Cerwin | A61B 8/08 600/439 |
| 2012/0229141 A1* | 9/2012 | Brown | G01R 33/422 324/322 |
| 2015/0008921 A1* | 1/2015 | Lee | G01R 33/56518 324/309 |
| 2015/0153431 A1* | 6/2015 | Hancu | G01R 33/4816 324/309 |
| 2017/0131372 A1* | 5/2017 | Dewdney | G01R 33/3875 |
| 2017/0160357 A1* | 6/2017 | Biber | G01R 19/0092 |

* cited by examiner

METHOD AND APPARATUS FOR EDDY CURRENT FIELD COMPENSATION IN MAGNETIC RESONANCE TOMOGRAPHY

BACKGROUND OF THE INVENTION

Field of the Invention

The present invention concerns a method for reducing an eddy current field in magnetic resonance tomography. The present invention further concerns a magnetic resonance apparatus that is designed to implement such a method.

Description of the Prior Art

In magnetic resonance tomography, magnetic field gradients generated by gradient coils are used for spatially encoding the magnetic resonance signals. The magnetic field gradients will switch on and off within milliseconds, which is why, due to induction, eddy currents are formed on the conductive structures surrounding the gradient coils. The eddy currents in turn magnetically generate eddy current fields that impair the resulting images in magnetic resonance tomography and reduce the quality thereof. A key factor in the generation of eddy current fields is due to structures in the magnetic resonance device that have a high electrical conductivity. Depending on the design of the magnetic resonance scanner, such a structure can be, for example, the cryostat of the magnet that generates the basic magnetic field.

It is known that eddy current fields will occur, and so the eddy current fields are analyzed and determined during the development and installation of the magnetic resonance apparatus, for example. The results that are obtained can be the basis for determining opposing fields to compensate for the eddy current fields that can be generated by the magnetic resonance scanner by time-dynamic control of gradient coils during a scan.

SUMMARY OF THE INVENTION

An object of the invention is to provide a method for dynamic reduction of eddy current fields. The invention further has the object of providing a system that is designed to carry out such a method.

The method according to the invention for reducing an eddy current field in magnetic resonance tomography implemented by a magnetic resonance data acquisition scanner, uses an eddy current field compensation unit that includes at least one sensor, a determination processor, and at least one conductor. The at least one sensor, determines a value that characterizes a conductivity of a structure in the scanner in which an eddy current is induced, and transmits this value to the determination processor. The determination processor determines a current strength in the at least one conductor, taking into account the sensor value to reduce the eddy current field and controls the at least one conductor with the current intensity.

An eddy current field can be induced by a changing magnetic field gradient. A rapidly alternating magnetic field, generated by at least one gradient coil, produces electric currents, in particular eddy currents, in conductive structures. The direction and the amplitude of the electric currents depend on the amplitude and switching cycle of the magnetic field gradients, as well as on the conductive structures surrounding the gradient coils.

The currents induced thus depend not only on the magnetic field gradients, but also on the electrical properties, such as the conductivity, of such structures. Consequently, a sensed value that characterizes conductivity noticeably affects the currents that have been induced. The sensed value that characterizes conductivity in turn may depend, for example, on the conditions of use and duration of use of the magnetic resonance scanner. The eddy currents become weaker again after the induction thereof, and therefore subside. This process also is dependent on the properties of the conductive structure on which the eddy currents form.

The eddy currents in turn induce magnetic fields that are superimposed on the magnetic field gradients, and consequently affect the homogeneity of the magnetic field gradients and of the basic magnetic field. Like the subsiding of the eddy currents, the subsiding of the eddy current fields is dependent on the sensed value. The more homogeneous the magnetic fields are during magnetic resonance imaging, the higher is the quality of the image that is to be displayed.

The method according to the invention uses an eddy current field compensation unit that is designed to compensate dynamically for eddy current fields. To this end, the eddy current field compensation unit has at least one sensor, a determination processor and a conductor. The eddy current field compensation unit uses these components to carry out the compensation or reduction of the eddy current fields. To this end, the eddy current field compensation unit, as described in detail below, makes use of algorithms that execute calculations and initiate steps to compensate for the eddy current fields.

The eddy current field compensation unit includes at least one sensor. The sensor is designed to determine a value that characterizes conductivity of a structure in the scanner in which an eddy current is induced during the magnetic resonance data acquisition operation of the scanner. The sensor can be, for instance, a device for the direct determination of such conductivity, or a thermometer, in which case the conductivity or the temperature consequently is the sensed value that characterizes conductivity. The sensor preferably determines more precisely the value in the core region of the distribution or spread of the value that is to be expected due to the environment of the sensor, than the sensor can determine values that fall outside the core area. The value is typically determined by the sensor as an absolute measurement value. It is also possible for the sensor to detect changes in the sensed value, preferably even very slight changes in the core region of the sensed value that is to be expected.

The aforementioned sensed value can be a first value, and in addition to this first value, a second value that characterizes the conductivity may be determined by a different sensor or by the at least one sensor. The eddy current field compensation unit can assign the same or a different priority to the first and the second values and transmit these to the determination processor that, in the determination of the current strength, takes the first and the second values into account according to the predetermined priority. Further values that characterize the conductivity are also possible.

As noted, the eddy current field compensation unit also includes a determination processor. The determination processor typically has a working memory and can, for example, be a part of the control computer of the magnetic resonance apparatus or make use of a part of the computing capability of that control computer. The control computer typically has an input and an output, but the determination processor, insofar as it forms part of the computer, can use the input or output or can have its own interfaces, such that the first value determined by the at least one sensor can be transmitted to the determination processor.

Via the determination processor, the eddy current field compensation unit can control a current strength in at least one conductor on the basis of the sensed value that has been determined. Such a conductor can be incorporated into an electric circuit and can be activated by the eddy current field compensation unit. The activation of the current strength in the conductor can ensue as a function of the conductor exclusively through the eddy current field compensation unit, or even by further units or components of the magnetic resonance scanner.

In the event of the exclusive operation of the conductor by the eddy current field compensation unit, the conductor is preferably arranged in the magnetic resonance scanner such that eddy current fields occurring in the examination region during a magnetic resonance scan can be eliminated and magnetic field gradients that are as homogeneous as possible and a homogeneous basic magnetic field are provided in the examination region. Alternatively, it is possible to use existing conductors in the magnetic resonance device to compensate for eddy current fields that occur during a scan. Examples of such electrical conductors are gradient coils or radio frequency coils. The original use of gradient coils is the generation of temporary magnetic field gradients, which can also be referred to as gradient pulses. To this end, the gradient coils are activated by currents upon which further currents can be superimposed for eddy current field compensation, for example. Depending on the design of the magnetic resonance apparatus, there are numerous further available conductors that can be used for this purpose.

The prerequisite for a conductor in order for the eddy current field compensation unit to be able to generate a current strength in this conductor is that the conductor has a connection to the eddy current field compensation unit and can be activated dynamically. The connection can be a direct interface between the conductor and the eddy current field compensation unit or determination processor. Further embodiments of a connection are possible.

The conductor is likewise designed to conduct a time-dependent current intensity. Both the amplitude and the polarity of the current strength are variable. The eddy current field compensation unit controls the current strength to compensate for eddy current fields as a function of influences such as the sensed value and/or the status of the scan, which gives an indication, for example, of the planned gradient pulses and the change in the sensed value that results therefrom.

Accordingly, the conductor must be designed to implement changes prescribed by the eddy current field compensation unit. The eddy current field compensation unit can activate the conductor, by directly prescribing a modifiable current strength for that conductor or indirectly, for example, by applying a modifiable electrical voltage. If, for example, an existing gradient coil is activated as the conductor for eddy current field compensation, then the generation of the current strength in the conductor can be carried out by the existing gradient coil controller assigned to the gradient coil.

The current generated in the conductor by the eddy current field compensation unit generates an opposing magnetic field that can counteract the eddy current field. The opposing field is preferably designed such that it largely eliminates the eddy current field, and preferably causes the basic magnetic field and the corresponding magnetic field gradients to be distributed homogeneously and without interruption in the examination region when the gradient coils are activated. There typically ensues a superimposition of the opposing field and the eddy current field and the result of the superimposition can be described as a superimposed field.

In order to achieve effective compensation of the eddy current field, the eddy current field compensation unit can determine the current strength to be applied for each individual conductor that can be activated. The determination preferably achieves the objective of optimally compensating for the eddy current field or reducing it as far as possible by generating the opposing field. The issue here is therefore that of optimizing and generating an opposing field such that the superimposed field has as little influence as possible on imaging. To achieve this, calculations, which can be carried out by the determination processor, are usually necessary. To calculate the resulting optimum current strength in a superimposed field with only slight influence on imaging, the determination processor can proceed as follows.

As noted, the value determined by the at least one sensor is made available to the determination processor. Likewise, the determination processor may be provided with further information, relating, for example, to the gradient pulses that are to be applied. The eddy current field is typically dependent on the activation of the gradient coils. Gradient coils are switched on and off during a scan using the magnetic resonance apparatus. The gradient coil switching sequence is dependent on the individual input by a user of a magnetic resonance apparatus and on the desired form of the images that are to be generated. For example, the spatial arrangement and extent of the examination region, and likewise the desired contrast, affect the switching of the gradients, that is, they affect the gradient pulses. If the user or operator of the unit has entered all the settings for scanning an examination subject, information on the gradient coil switching sequence can then be provided to the eddy current field compensation unit. Usually, a number of gradient coils, which generate magnetic field gradients in different directions, are activated. Each switching procedure in a gradient coil, that is, each gradient pulse, typically induces an eddy current on a conductive structure or surface that is positioned sufficiently close to the gradient coil, such that the magnetic field change is able to induce an electric current on the structure. The eddy currents and the associated eddy current fields may be dependent on the conductivity of the conductive structure or surface on which the eddy currents form. The conductivity is characterized by the sensed value, and the sensed value in the surroundings of the conductive structure or surface may likewise influence the eddy current fields.

On the basis of the sensed value, the determination processor can determine a current strength in at least one conductor to generate the opposing field. Preferably this initially involves the eddy current field being determined. The determination of the eddy current field may ensue on the basis of a calculation, or may have been determined for the gradient pulse or magnetic field gradients before carrying out the method, numerically, analytically or experimentally, for example, and be supplied to the determination processor, for instance in the form of a database that is stored on a memory of the magnetic resonance apparatus that the determination processor can access. The eddy current field is time-dependent and changes during the gradient coil switching sequence. Each gradient pulse is able to generate a new eddy current field that becomes superimposed on the eddy current fields that have been induced earlier, and which are typically abating. Consequently, the progression over time of each eddy current field that has been induced by a gradient pulse is preferably considered individually, and the method according to the invention for reducing an eddy current field is carried out for each gradient pulse. It is advantageous to take into account in the method expected changes in the sensed value due to all the planned gradient pulses within a magnetic resonance control sequence.

Alternatively, for the determination of the eddy current field and the opposing field, it is also possible to select a longer time period than the duration that includes a gradient pulse and the resulting eddy current field. The temporally changeable opposing field for the longer time period can be taken into consideration in advance based on the sequence of gradient pulses that is to be expected, and optionally based on the resulting evolution of the first value. The eddy current field induced by a gradient pulse is preferably considered here.

When the determination processor has determined the eddy current field that is to be expected, then the determination processor can determine a current strength in at least one conductor so as to generate the opposing field that reduces or compensates for the eddy current field. The extent of the reduction in the eddy current field depends on the conductors available that the eddy current field compensation unit can use to generate the opposing field.

The eddy current field compensation unit is able to activate at least one conductor so as to generate an opposing field. The opposing field may be dependent on the geometrical extent and three dimensional volume of the conductor, and likewise on the dynamic setting of the current strength in the conductor or the sensed value. For each conductor, specifications may apply, such as a maximum current strength or maximum frequency. The aforementioned specifications for a conductor, and the opposing field thereof, including the aforementioned dependencies, are preferably known before the method is carried out, and are stored in a memory of the magnetic resonance apparatus or of the eddy current field compensation unit, for example. The determination processor has access to the storage site. If two or more conductors are available to generate an opposing field, then the specifications for the conductors and information relating to the respective opposing fields are preferably known individually for each conductor.

The determination of the opposing field is preferably made based on the expected eddy current field, for which compensation is to be made. On the basis of the information supplied to the determination processor relating to the eddy current field, the sensed value, and the at least one conductor, the determination processor can determine how the current strength needs to be set in the at least one conductor in order to achieve a reduction in the eddy current field. The superimposed field is preferably minimized or homogenized in a predetermined region, for example in the examination region of the magnetic resonance scanner. To this end, the determination processor can implement calculations that take into account the information or influences that have been provided. The determination processor can also take into account reciprocal effects or feedback events that may occur, for example, between eddy currents, eddy current fields, and currents in one or more conductors and opposing fields.

An opposing field that entirely compensates for the eddy current field typically cannot be achieved only by dynamically specifying a current strength in the at least one conductor. Likewise, the activation of a number of conductors with different current intensities is in most cases insufficient. It is conceivable for a user to specify the objective of a determination of an opposing field, that is, for example, the minimization or the homogenization of the superimposed field.

After the determination of the opposing field has been completed, the determination processor can provide the required specifications for the progression of the current strength in the at least one conductor in the eddy current field compensation unit. The eddy current field compensation unit can activate the at least one conductor with the corresponding current intensity, so that the eddy current field is preferably reduced or compensated in a time-dependent manner by an opposing field.

An advantage of the method is that, due to the sensed value being taken into account, the precision of eddy current compensation is increased, the magnetic fields used for the magnetic resonance imaging are consequently more homogeneous, and an improved image quality can be achieved. This is particularly advantageous in magnetic resonance apparatuses that encompass conductive components, on which strong eddy currents can form.

The method is likewise particularly advantageous in an alternating operation of magnetic resonance activation sequences that produce an above-average increase in the conductivity of an eddy current-carrying structure due to a rise in temperature, and of magnetic resonance activation sequences, in which the heated eddy current-carrying structure, eddy currents or eddy current fields have an above average level of impact on image quality. Magnetic resonance activation sequences describe the time sequence of magnetic field gradients and high frequency fields that are used for the generation of image data.

In an embodiment of the method, the sensed value is a temperature.

The at least one sensor consequently determines the temperature. The temperature can be used, particularly with metal, as a yardstick for the conductivity of the material. Consequently, the sensor is preferably mounted and designed such that it can determine the temperature of a structure on which eddy currents are to be expected. Knowledge of the material in the structure and the temperature allow the conductivity of the structure to be determined. Since the material in the structure, which is typically a component of the magnetic resonance scanner, is known, the conductivity of the structure can be determined on the basis of the measurement results from the sensor and, for example, can be monitored during a magnetic resonance scan. According to the method of the invention, the eddy current field compensation can be adjusted dynamically to the conductivity that has been determined.

The advantage of the selection of the temperature as the sensed value is that, with metals in particular, the conductivity thereof can be precisely determined by its temperature. Furthermore, temperature sensors are robust and available in many variants, so that a sensor that determines changes in the temperature in the value range that is expected can be selected in a particularly sensitive manner.

In another embodiment of the method, the at least one sensor is arranged on a conductive and eddy current-carrying structure of a magnetic resonance device to determine the sensed value of the conductive and eddy current-carrying structure.

The majority of the components of a magnetic resonance scanner, in particular components of the basic field magnet, are usually made of metal. These components are conductive. Examples thereof are the helium vessel, in which the magnetic coils are generally cooled with liquid helium, and the cooling shield. If such a component is situated so that the magnetic field gradients at the location of the component are not negligible, then eddy currents are induced. The strength of the eddy currents is additionally dependent on the conductivity, the shape and the three-dimensional extent of the structure.

The at least one sensor for the determination of the value that characterizes a conductivity is preferably fitted onto a conductive and eddy current-carrying structure, that makes an above-average contribution or the greatest contribution to the resulting eddy current field. Alternatively, the at least one sensor can be fitted onto the conductive and eddy current-carrying structure that for example, due to the material of which it is made or to insufficient cooling, is heated more than other structures and/or the conductivity of which changes more than the conductivity of other structures. If two or more sensors are used, these can also be mounted on different conductive and eddy current-carrying structures, and can determine the sensed value for the respective structures and transmit the sensed value to the determination processor. The determination processor is able to take into account the sensed value or values that have been determined by the various sensors according to the position thereof.

The sensor can be mounted on the conductive and eddy current-carrying structure, by being directly in contact with the structure, and for example being fixed thereon. It is equally possible for the sensor not to be directly fitted or mounted onto the structure, but mounted or fitted in a different position, such that it can determine the sensed value from the conductive and eddy current-carrying structure in at least one location. This location can be, for example, a point on the surface of the structure.

Structures that are particularly clean and therefore have particularly good conductivity at low temperatures which, due to the associated long time constants for the temperature, are advantageous for magnetic resonance imaging. The ensuing side effects are high temperature sensitivities of the conductivity and hence higher temperature-dependent, and hence also time-dependent, variations in the eddy current properties. The effect is more pronounced in systems in which the conductive structures on which the eddy currents are able to form, are not cooled directly. As a result, the temperature of the conductive structure, and hence its conductivity, are subject to greater fluctuations.

There are magnetic resonance apparatuses that have a magnet former that ensures the correct position of the superconducting magnetic coils. Strong eddy currents that generate eddy current fields typically arise on the magnet former due to the material and shape thereof. The eddy current fields induced by the magnet former are typically stronger than the eddy current fields induced by other components. Here, the magnet former is located, together with the magnetic coils, in a coolant that keeps the temperature and the conductivity of the magnet former constant. In this case, the eddy current field compensation is typically only slightly influenced by taking into account the sensed value, which characterizes the conductivity of the conductive and eddy current-carrying structure.

An adjustment of the eddy current field compensation to a changed sensed value is particularly advantageous if the eddy current-carrying structure is not placed in a coolant. This applies to magnetic resonance apparatuses without a magnet former and also to magnetic resonance apparatuses, the magnet former of which does not significantly contribute to the eddy current field as a whole. If the eddy currents form in such a magnetic resonance apparatus mainly on the cooling shield, for example, then a stable eddy current field compensation can be achieved, by having the sensed value determined on the cooling shield by the sensors. If magnetic resonance apparatuses are operated intensively, that is, with strong and/or rapidly switched magnetic field gradients, then the temperature of the cooling shield, which is not directly cooled with helium, will rise, along with the conductivity thereof. As a result, the inaccuracy of the eddy current field compensation will increase if the conductivity is not taken into account.

The advantage of this design is that the sensed value relating to the structure on which the eddy currents form as a function of the sensed value can be determined, and the eddy currents preferably make a significant contribution to the eddy current field. Knowledge of the sensed value allows the eddy current field and hence the opposing field to be determined more precisely, such that the eddy current field compensation can be carried out more effectively.

In an embodiment of the method, the conductive and eddy current-carrying structure on which the at least one sensor is arranged is designed such that
  it has a time constant for the temperature that describes an abatement characteristic of the temperature after a change in the temperature, and
  it has an eddy current time constant that describes an abatement characteristic of an eddy current that induces the eddy current field,
  and the time constant for the temperature is greater than the eddy current time constant.

Temperature is a value that characterizes the conductivity of the conductive and eddy current-carrying structure. The temperature of the conductive and eddy current-carrying structure can be changed by external influences. For example, switching of gradient coils can bring about an increase in temperature, while an adjacent coolant can lower the temperature of the conductive and eddy current-carrying structure. If the cause of the temperature change is removed, such as when the gradient coils are no longer activated once a magnetic resonance scan has been completed, then the temperature of the structure will again approach the original value. This temperature change is a continual process, the progression over time of which can be described by means of the time constant. The time constant quantifies the abatement (decay) characteristic of the structure, that is, it quantifies the temperature change as a function of time progression. The time constant is typically given as a time value. The time constant can depend on the material in the conductive and eddy current-carrying structure, and also on the spatial extent thereof and on the initial temperature.

The time constant can be determined experimentally, numerically, or analytically, for example, before carrying out the method, on the basis of knowledge about the material in the structure, and can be made available to the determination processor when the method according to the invention is implemented.

Furthermore, the conductive and eddy current-carrying structure has an eddy current time constant, which characterizes the progression over time of the eddy current that induces the eddy current field after the induction thereof. The eddy current time constant describes the abatement (decay) characteristic of the eddy current, that is, the temporal progression after the induction thereof. The eddy current time constant preferably takes into account the temperature of the conductive and eddy current-carrying structure, which may possibly change even during the abatement of the eddy current. Like the time constant for the temperature, the eddy current time constant is typically shown as a time value.

The eddy current time constant can likewise be determined experimentally, numerically, or analytically, for example, before carrying out the method, and can be supplied to the determination unit on the basis of material in the structure and the determination unit can be made available when the method according to the invention is implemented.

The conductive and eddy current-carrying structure on which the at least one sensor is fitted has a time constant with regard to temperature that is greater than the eddy current time constant. Eddy currents induced on the conductive and eddy current-carrying structure thus abate faster than the temperature does, after a rise in the temperature of the conductive and eddy current-carrying structure.

An advantage of temperature monitoring of such an eddy current-carrying structure is that an increased temperature drops only very slowly to its initial value, and the temperature consequently remains approximately constant over a longer period, yet is increased in relation to the starting value, while the eddy currents induced on the structure abate and are not affected by significant temperature changes, but only by the initial increased temperature.

In an embodiment of the method, the first value is a mean of a value that characterizes the conductivity of the conductive and eddy current-carrying structure.

Accordingly, the eddy current field compensation unit determines the mean, preferably the average, of a value that characterizes the conductivity of the structure. This mean or average value preferably relates to the three-dimensional mean value for the structure. This mean value is preferably determined by multiple sensors that are arranged on the structure and simultaneously acquire a value that characterizes the conductivity of the structure at the individual positions of the respective sensors. From this, the eddy current field compensation unit can determine the mean value, transmit it to the determination processor, optionally taking into account the position of the individual sensors, and the processor determines a current strength in the at least one conductor, taking into account the mean value for the reduction of the eddy current field.

An advantage of this variant of the method is that the eddy current field compensation does not take into account a local value, which may not be accurately representative of the eddy current-carrying structure, but instead uses an average value. The accuracy of the eddy current field compensation is increased as a result.

In another embodiment of the method, the value is temperature and an abatement characteristic of the temperature of the conductive and eddy current-carrying structure is taken into account in the determination of the current strength in the at least one conductor.

Depending on the material and the design of the conductive and eddy current-carrying structure, after an increase or a drop, the temperature becomes close to its initial value. The at least one sensor can detect the absolute temperature at a point in time or over a time progression. In the method according to the invention, the temperature is taken into account in the determination of the opposing field. The abatement time for the temperature depends on the extent of the temperature change, and on external factors, such as the ambient temperature. The longer the temperature is increased in comparison to the initial value, the longer the eddy currents typically require to abate, such that an eddy current field compensation is required for a longer period.

Not only can the abatement characteristics be taken into account, but also the expected magnetic field gradients, which can induce a further temperature change. If the dynamic characteristic of the temperature is not taken into account predictively as described, it is necessary to measure the temperature at regular, shorter intervals and to carry out a fresh determination of the opposing field after each determination.

Since both the temperature and the eddy current field to be compensated for undergo a change over time, the accuracy of the eddy current field compensation increases as time progresses if the abatement characteristic, that is, the temperature change on the conductive and eddy current-carrying structure, is taken into account.

In another embodiment of the method, determination processor of the eddy current field compensation unit is provided with a model for the reduction of the eddy current field, which model describes the eddy current field as a function of the value.

The eddy current field compensation unit reduces eddy current fields by taking into account the sensed value, preferably by determining the eddy current field that is to be expected and determining a current in at least one electrical conductor that, when activated, generates an appropriate opposing field. The eddy current field that is to be expected due to a magnetic field gradient is preferably determined when the gradient pulse that is to be triggered is known.

This eddy current field is dependent on the sensed value that characterizes the conductivity of the structures or surfaces on which eddy currents that induce the eddy current field are formed. The eddy current field, which is triggered by a magnetic field gradient, changes over time and as a function of the sensed value. The model in accordance with the invention includes the eddy current field, and the changes therein over time, preferably as a function of the sensed value, the period of time that has passed since the application of the magnetic field gradient, and optionally further characteristics of the magnetic field gradient that is to be triggered, such as the amplitude or duration thereof. The function may depend on this and further parameters and the model preferably includes all the values of these parameters that can occur during a magnetic resonance scan. For example, the range of values for the sensed value should include the possible values for the sensed value in magnetic resonance scans.

The model can be stored in a database or saved in a memory, which the determination processor of the eddy current field compensation unit can access when implementing the method. Consequently, in order to implement the method according to the invention for reducing an eddy current field, the determination processor of the eddy current field compensation unit can be supplied via such a model with the required information about the eddy current field assigned to a magnetic field gradient, and assigned to a sensed value.

The determination of the eddy current field, which generally involves complex measurements, is consequently not connected with the examination of a patient. The model can be configured in advance by a developer of the magnetic resonance apparatus, for example experimentally or by theoretical analyses, and provided to the operator during a scan. As a result, complex calculations are no longer necessary, which accelerates the scan.

In an embodiment of the method, the model includes an abatement characteristic of an eddy current that induced the eddy current field.

In addition to the aforementioned sensed value, the model can take into account the progression over time of the eddy current and/or of the eddy current field. The model can include not only the eddy current time constant but also information relating to the time dependence of the amplitude and to changes in the spatial distribution. Preferably the model also includes the time constant for the temperature of the eddy current carrying structure, on which the sensor is mounted, as well as the influence of a changing temperature and/or conductivity on the eddy current field. The progression of the eddy current field over time thus can be determined comprehensively, and based thereon, likewise the progression over time of the corresponding opposing field can be comprehensively determined. The method according to the invention can be implemented for each magnetic field gradient that is to be activated, or can be implemented for a period of time by the comprehensive model, in which multiple gradient pulses are activated and eddy current fields are generated.

On the basis of such a comprehensive model, the eddy current field compensation unit can determine the eddy current field that is to be expected and the progression thereof over time with particular precision. Consequently, the opposing field can be optimally adjusted to the characteristics of the eddy current field, such that a reduction in the eddy current field can be created in a particularly effective manner.

In an embodiment of the method, the model is created, wherein
- the sensed value is changed by a stepped temperature change in the range of values that can be detected by the sensor,
- the eddy current field is determined for various values of the first value and assigned in each case to the corresponding first value, and
- is stored in a form such that the assignment can be provided as a model to the eddy current field compensation unit.

This part of the method is typically implemented before the part of the method as initially described and constitutes an experimental approach for the determination of a model that is provided to the eddy current field compensation unit to reduce eddy current fields. The experimental determination of the model can be done, for example, by the manufacturer of the magnetic resonance apparatus on a one-off basis for that type of magnetic resonance device or when installing each magnetic resonance device. Likewise, an automatic implementation on a device that is already installed is conceivable, which implementation ensues automatically at regular intervals or after the input of manual instructions by a user, for example.

The goal of the model is to create a link between the sensed value and the eddy current field and provide this link to the eddy current field compensation unit. The first value characterizes the conductivity; it can therefore also directly be the temperature that is changed. If the sensed value is not the temperature, then it can be advantageous to use one or more sensors that determine the sensed value and the temperature, respectively. Consequently, a number of sensors and different sensors can be used.

The sensor used in the method according to the invention is typically used when creating the model, preferably in the same position. The sensor can be mounted, for example, on a conductive and eddy current-carrying structure. The sensor is mounted on the structure on which eddy currents that generate significant eddy current fields form, from which structure the primary contribution to the eddy current field therefore originates.

In the first method step, the sensed value changes as a result of a temperature change, such that the sensor can detect the change in the sensed value. Preferably, the temperature of the conductive and eddy current-carrying structure to which the sensor is attached is changed. This can ensue in various ways depending on the position of the sensor. For example, the temperature can be produced in a controlled manner by applying strong magnetic field gradients or by temporarily switching off the magnet cooling. The temperature can be changed within the function range of the magnetic resonance scanner or the value range of the sensor, for example. Initially, the sensed value is measured at a starting temperature and the eddy current field is characterized.

For this purpose it is necessary to generate an eddy current field. This typically ensues by switching gradient coils, or applying gradient pulses. Since the eddy current field can be dependent on the progression over time of a gradient pulse, an eddy current field that is generated that preferably is characterized not only as a function of the sensed value and optionally of temperature, but also as a function of various switchings of the one or more (if present) gradient coils.

The determination of the eddy current field can include the measurement of the spatial distribution and direction of the amplitude and the direction of the eddy current field, and likewise the progression thereof over time. The measurement can be done during or after the completion of the eddy current field-inducement. In a measurement after completion of the switching of gradient coils, the abatement characteristic of the eddy current field can be determined, namely a measurement of how the eddy current field is abating and the duration of the abatement. Furthermore, the characterization of the eddy current field may include the eddy currents that generate the eddy current fields, such as the abatement characteristic and the determination of the eddy current time constant. The properties that are determined during the characterization of the eddy current field produce the eddy current field characteristics.

After the characterization of the eddy current field at a starting temperature, the temperature can be changed in stages, in at least one temperature-changing step. Depending on the desired accuracy, the temperature steps can be amount to one or a plurality of degrees Kelvin. At each temperature step, a measurement of the first value and a characterization of the eddy current field as at a starting temperature are carried out. After completion of the stepped determination of eddy current fields, eddy current field characteristics are available as a function of the values for the first value at which a scan was carried out. They are therefore assigned accordingly. It is conceivable for an interpolation of the available eddy current field characteristics to be carried out for temperatures located within the measured temperature range and in which no measurement was carried out, such that a continual function of the eddy current field characteristics is present as a function of the sensed value.

This continual function, or the step-by-step allocation, can be stored in the form of a database on a memory, for example, and can be provided as a model to the eddy current field compensation unit. The eddy current field compensation unit can consequently use the eddy current field characteristics as a function of the sensed value for optimizing the opposing field to reduce the superimposed field without this having to be determined during the inventive method. This increases the accuracy of the method and increases the speed, which allows shorter scanning times. In addition, this experimentally determined model is able to be more accurate than a model determined by theoretical considerations since, in such simulations, not all the influences on the result can be taken into account.

Furthermore, the invention encompasses a magnetic resonance apparatus with an eddy current field compensation unit as described above.

By taking into account the sensed value in the eddy current field compensation, the invention allows a greater reduction in the eddy current field and hence a greater homogeneity of the magnetic fields, which is reflected in an improved image quality. This is particularly advantageous in magnetic resonance apparatuses that include conductive components on which firstly strong eddy currents can form and that are subject to strong fluctuations in temperature, and consequently in conductivity. The invention is particularly advantageous in an alternating operation of magnetic resonance activation sequences that raise the temperature in an eddy current-carrying structure to an above average level, and magnetic resonance activation sequences, in which the heated eddy current carrying structure, eddy currents, or eddy current fields have an above-average effect on image quality. In particular, the invention determines the sensed value of the structure, on which the eddy currents that make a significant contribution to the eddy current field are formed, by positioning the sensors accordingly. Furthermore, the abatement characteristic of the eddy currents or of the eddy current field can be taken into account in the eddy current field compensation, preferably as a function of the first value, which additionally increases accuracy. The additional account of the time constant for the temperature additionally increases the precision. The magnetic resonance device data required for the eddy current field compensation and the eddy current field characteristics dependent on the first value can be stored in a model, which can accelerate the determination of the eddy current field compensation and thus the scanning time. A particularly precise model that is individually tailored to the magnetic resonance device can be determined experimentally according to the invention.

The advantages of the magnetic resonance apparatus according to the invention essentially correspond to the advantages of the method according to the invention for reducing an eddy current field in magnetic resonance tomography, which have been described in detail above. Features, advantages, and alternative variants of the method are likewise applicable to the apparatus.

DESCRIPTION OF THE PREFERRED EMBODIMENTS

Figure 1:
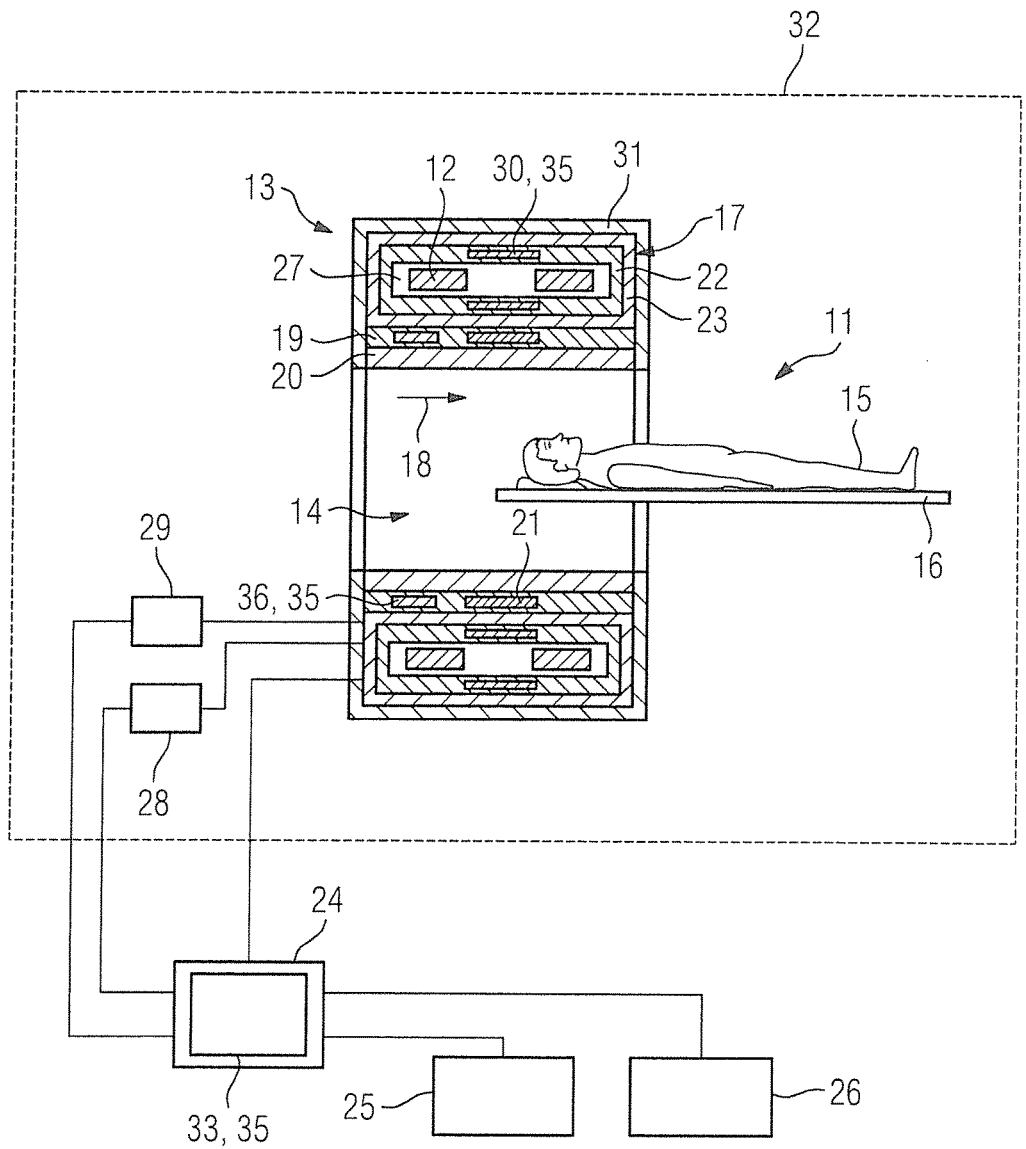
FIG. 1 schematically illustrates a magnetic resonance apparatus according to the invention.

FIG. 1 shows a magnetic resonance apparatus according to the invention 11 in a schematic illustration. The magnetic resonance apparatus 11 has a scanner 13 with a basic field magnet 17. The basic field magnet 17 has magnetic coils 12 made of superconductive material for generating a strong and constant basic magnetic field 18. The magnetic coils 12 are located in a helium vessel 27, which is typically manufactured of stainless steel and is filled with liquid helium to cool the magnetic coils 12. The helium vessel 27 is in the form of a hollow cylinder and is surrounded by a cooling shield 22, likewise in the form of a hollow cylinder. The cooling shield 22 can be made of aluminum and typically has a temperature of 60 Kelvin in the operational state of the magnetic resonance apparatus 11. The cooling shield 22 is in turn surrounded by a vacuum chamber 23, which seals the basic field magnet 17 from the external environment. The vacuum chamber 23 is typically made of stainless steel.

The cooling shield 22 is a conductive structure, on which eddy currents can form. Due to the material used in the cooling shield 22, eddy currents arise thereon during a scan, which in a magnetic resonance apparatus 11 without a magnet former, contribute most to the eddy current field.

In a first approximation, eddy current time constants are proportional to the product of the thickness and the conductivity of a material, which is why in the present magnetic resonance apparatus 11, the structures made of stainless steel determine the eddy current characteristic for only a short time. The cooling shield 22 consequently determines the abatement of the eddy current. Mounted onto the cooling shield 22 are sensors 30, which determine a value that characterizes the conductivity of the cooling shield 22, in this case the temperature of the cooling shield 22, at the individual positions of the sensors 30. The sensors 30 preferably determine the mean temperature of the cooling shield 22 therefrom. The sensors 30 are consequently temperature sensors. Since the cooling shield 22 is not located in the helium vessel 27, the time constant for the temperature of the cooling shield 22 is clearly longer than the time for a typical temperature rise due to strong magnetic field gradients. It is therefore possible, for instance, for the cooling shield 22 to undergo a temperature rise of around 7 Kelvin in 30 minutes due to strong magnetic field gradients, while around 30 hours are needed to cool the cooling shield 22 down to the initial temperature again. The eddy current time constant in the cooling shield 22 is lower than the time constant for the temperature.

In addition, the magnetic resonance apparatus 11 has a cylindrical patient accommodation area 14 to accommodate a patient 15, the patient accommodation area 14 being cylindrically surrounded in a circumferential direction by the magnet unit 13. The patient 15 can be moved into the patient accommodation area 14 by a patient-positioning device 16. The patient-positioning device 16 has for this purpose a couch that is moveable inside the scanner 13. The scanner 13 is protected from the external environment by a housing shell 31.

The scanner 13 further has a gradient coil arrangement 19 that generates magnetic gradient fields, which are used for spatial encoding during imaging. Die gradient coil arrangement has a gradient coil 21. The gradient coil arrangement 19 is activated by a gradient controller 28. Furthermore, the scanner 13 has a radio frequency antenna 20 that, in the embodiment shown, is configured as a body coil that is fixedly incorporated into the scanner 13, and a radio frequency antenna controller 29. The radio frequency antenna 20 is activated by the radio frequency antenna controller 29 to emit radio-frequency magnetic resonance excitation sequences into an examination area that is essentially formed by the patient accommodation area 14. The radio frequency magnetic resonance sequences cause certain nuclear spins in the patient 15 to be deflected from an equilibrium magnetization that is aligned with the field lines of the basic magnetic field 18. As these excited nuclear spins relax, they emit radio frequency magnetic resonance signals. The radio frequency antenna 20 is further designed to receive the magnetic resonance signals from the patient 15.

To control the basic magnet 17, the gradient controller 28, and the radio frequency antenna controller 29, the magnetic resonance apparatus 11 has a computer 24. The computer 24 centrally controls the magnetic resonance apparatus 11 by, for example, running a predetermined gradient echo imaging sequence. Control data, such as imaging parameters, and reconstructed image data, can be displayed to a user on a display unit 25, for example, on at least one monitor of the magnetic resonance apparatus 11. In addition, the magnetic resonance apparatus 11 has an input unit 26, via which data and/or parameters can be entered by a user during a scanning procedure. The computer 24 can encompass the gradient controller 28 and/or the radio frequency antenna controller 29 and/or the display unit 25 and/or the input unit 26.

The magnetic resonance apparatus 11 has an image data acquisition unit 32. In the present case, the image data acquisition unit 32 is formed by the scanner unit 13, together with the radio frequency antenna controller 29 and the gradient controller 28. The computer 24 further includes a determination processor 33. The magnetic resonance apparatus 11 further includes an eddy current field compensation unit 35 for determining and generating an opposing field to reduce an eddy current field. With the determination processor 33 and the sensors 30, the eddy current field compensation unit 35 includes a conductor 36, which the eddy current field compensation unit 35 can activate with a current strength to generate an opposing magnetic field. The conductor 36 can be a component of the gradient coil arrangement 19.

The magnetic resonance apparatus 11, together with the eddy current field compensation unit 35, including the determination processor 33, the sensors 30 and the conductor 36, is consequently designed to implement the method according to the invention.

The magnetic resonance apparatus 11 that is shown may include further components that magnetic resonance apparatuses usually have. The general mode of operation of a magnetic resonance apparatus is known to those skilled in the art, so a more detailed description of the operation and the further components is not necessary herein.

Figure 2:
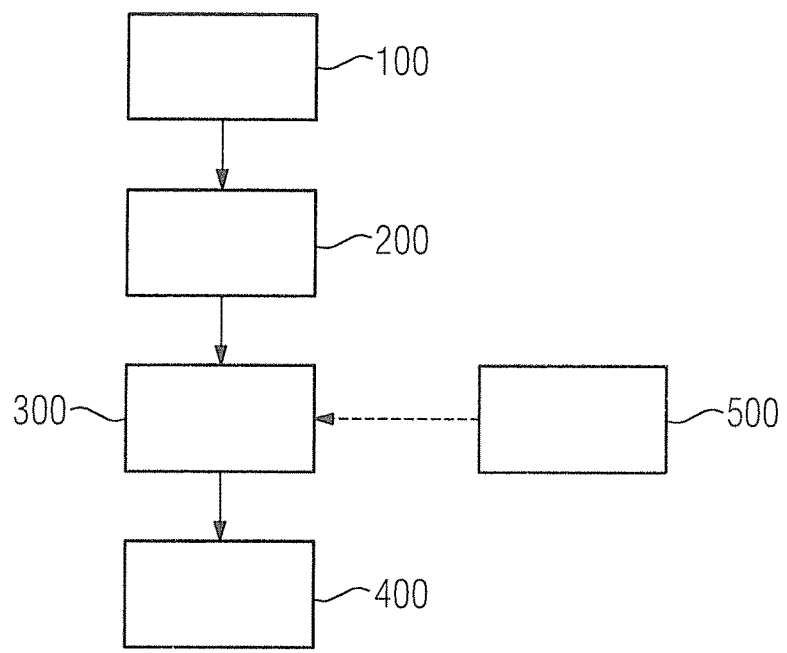
FIG. 2 is a flowchart of an embodiment of the method according to the invention.

FIG. 2 is a flowchart for a first embodiment of the method according to the invention for reducing an eddy current field in magnetic resonance tomography. The aim of the method is the generation of a dynamic opposing field that counteracts the eddy current field, such that the magnet fields used in magnetic resonance tomography are as homogeneous as possible.

The method according to the invention begins with step 100, in which the eddy current field compensation unit 35 determines a temperature by means of at least one sensor 30. When a number of sensors 30 are used, the temperature is determined at a plurality of positions. From this, the eddy current field compensation unit 35 can form the mean value and use it in the further course of the method. The temperature can either be determined by the at least one sensor at precisely one point in time or monitored continually. In the case of continual monitoring of the temperature, step 100 and the following process steps can be repeated continually or at time intervals.

After the temperature has been determined, in step 200 the eddy current field compensation unit 35 transmits the temperature to the determination processor 33 that, in step 300, determines a current strength in at least one conductor 36, taking the temperature into account. Here, the determination of the current strength ensues with the aim of reducing the eddy current field by generating an opposing field. If a sensor 30 is mounted on a conductive and eddy current-carrying structure and the abatement characteristic of the temperature in the conductive and eddy current-carrying structure is known to the eddy current field compensation unit 35, the abatement characteristic of the temperature in the conductive and eddy current-carrying structure can be taken into account in the determination of the current strength in the at least one conductor 36.

In an optional step 500, a model that describes the eddy current field as a function of the temperature can be provided to the eddy current field compensation unit 35. The model can also include an abatement characteristic of an eddy current that induces an eddy current field. If the optional step 500 is implemented, then in step 300, the eddy current field compensation unit 35 will take into account the data supplied by the model and implement the determination or optimization of the current strength on the basis of the model.

In step 400, the eddy current field compensation unit 35 activates the at least one conductor 36 with the corresponding predetermined current strength.

Figure 3:
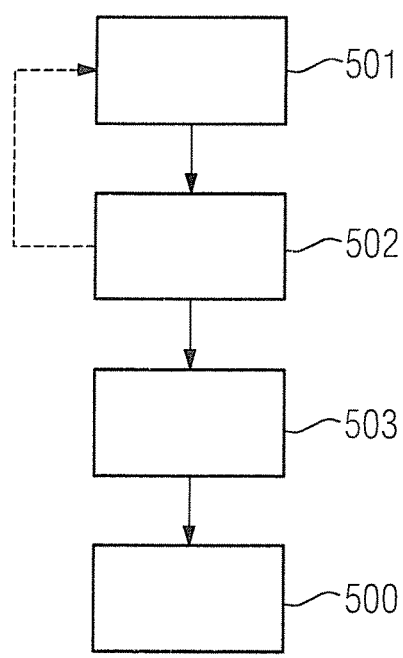
FIG. 3 shows an alternative flowchart of another embodiment of the method according to the invention.

FIG. 3 shows an alternative flowchart for an embodiment of the method according to the invention. The aim of the method is to provide a model that can be used in the aforementioned step 300. The method describes how the model can be generated experimentally. To this end, in step 501, a temperature is set in the value range that can be detected by the sensor 30 and in step 502, the eddy current field is determined at the temperature that has been set. In addition to the eddy current field, further characteristics assigned to the eddy current field can be determined experimentally or theoretically and assigned to the temperature that has been set. After the completion of the determination of the eddy current field, a further temperature can be set in the value range that can be detected by the sensor 30 (step 501) and the corresponding eddy current field can be determined anew (step 502). Steps 501 and 502 can be repeated alternately as desired, preferably until the eddy current fields in the temperature range affected by a possible rise in temperature have been determined. The temperature steps can be selected according to the desired level of precision and intermediate steps can optionally be supplemented by interpolation.

In step 503, the allocation to the respective temperature of the eddy current fields that have been determined is stored, in the form of a function or a database, for example. The storage site can be a hard disk in the computer 24, for example. The storage ensues such that the data format can be processed by the eddy current field compensation unit 35 in step 300. The storage site can also be a mobile data carrier that can transmit the model to a number of magnetic resonance apparatuses 11 such that the eddy current field compensation units 35 in the magnetic resonance apparatuses 11 can have access thereto.

In summary, the invention concerns a method and apparatus for magnetic resonance tomography wherein an eddy current field is compensated, taking into account its progression over time and its dependence on a sensed value, by having a sensor determine the sensed value and, on the basis of the sensed value, a current strength for a conductor in order to generate an opposing field to reduce the eddy current field is determined for supply to the conductor.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for reducing an eddy current field in a magnetic resonance data acquisition scanner comprising: with a sensor situated on an electrically conductive structure of a magnetic resonance data acquisition scanner, obtaining a sensed temperature value that characterizes conductivity of said conductive structure in which an eddy current is induced during operation of said scanner, said eddy current producing an eddy current field, said conductive structure having a time constant of said temperature therein that represents an abatement characteristic of said temperature after a change in said temperature, and has an eddy current time constant that describes an abatement characteristic of said eddy current induced in said conductive structure, and wherein said time constant of said temperature is larger than said eddy current time constant; transmitting said sensed temperature value to a determination processor; in said determination processor, determining a current strength of a current of a conductor in said scanner, dependent on said sensed temperature value and said abatement characteristic, that will reduce said eddy current field; and from said determination processor, causing said current with said current strength to be supplied to said conductor.

2. A method as claimed in claim 1 comprising sensing said sensed temperature value as a mean of temperature values that characterizes characterize said conductivity.

3. A method for reducing an eddy current field in a magnetic resonance data acquisition scanner comprising: with a sensor situated on an electrically conductive structure of a magnetic resonance data acquisition scanner, obtaining a sensed temperature value that characterizes conductivity of said conductive structure in which an eddy current is induced during operation of said scanner, said eddy current producing an eddy current field, said conductive structure having a time constant of said temperature therein that represents an abatement characteristic of said temperature after a change in said temperature, and has an eddy current time constant that describes an abatement characteristic of said eddy current induced in said conductive structure, and wherein said time constant of said temperature is larger than said eddy current time constant; transmitting said sensed temperature value to a determination processor; in said determination processor, determining a current strength of a current of a conductor in said scanner, dependent on said sensed temperature value and said abatement characteristic, that will reduce said eddy current field; from said determination processor, causing said current with said current strength to be supplied to said conductor; and providing said determination processor with a model that describes said eddy current field as a function of said sensed value, and, in said determination processor, determining said current using said model.

4. A method as claimed in claim 3 wherein said model, models said abatement characteristic of the eddy current in said structure that induces said eddy current field.

5. A method as claimed in claim 3 comprising sensing, as said sensed value, a value that characterizes said conductivity that changes with temperature of said structure, and comprising generating said model by: changing said sensed temperature value by generating a stepped temperature change in said structure in a range of sensed values detectable by said sensor; measuring said eddy current field for respective values of said sensed temperature value in said range and assigning a measured eddy current field value respectively to each sensed value; and storing the measured eddy current field values respectively assigned to the sensed temperature values as said model.

6. A magnetic resonance apparatus comprising: a magnetic resonance data acquisition scanner comprising an electrically conductive structure in which an eddy current is induced by an eddy current field that arises during operation of said scanner, said conductive structure having a time constant of said temperature therein that represents an abatement characteristic of a temperature after a change in said temperature, and has an eddy current time constant that describes an abatement characteristic of said eddy current induced in said conductive structure, and wherein said time constant of said temperature is larger than said eddy current time constant; a sensor, situated on said conductive structure that obtains a sensed value of said temperature that characterizes conductivity of said conductive structure in which said eddy current is induced during operation of said scanner; a determination processor to which said sensor transmits said sensed temperature value; said determination processor, being configured to determine a current strength of a current of a conductor in said scanner, dependent on said sensed temperature value, that will reduce said eddy current field; and said processor, being configured to cause said current with said current strength to be supplied to said conductor.

7. A magnetic resonance apparatus comprising: a magnetic resonance data acquisition scanner comprising an electrically conductive structure in which an eddy current is induced by an eddy current field that arises during operation of said scanner; a sensor that obtains a sensed value that characterizes conductivity of said electrically conductive structure in which said eddy current is induced during operation of said scanner; a determination processor to which said sensor transmits said sensed value; said determination processor being configured to use a model that describes said eddy current field as a function of said sensed value in order to determine a current strength of a current of a conductor in said scanner that will reduce said eddy current field, wherein the model includes a time constant for the sensed value of the eddy current of the electrically conductive structure and the sensed value is a sensed temperature value; and said processor being configured to cause the determined current strength of the conductor to be supplied to said conductor.

* * * * *